United States Patent
Dell et al.

[11] Patent Number: 5,926,827
[45] Date of Patent: Jul. 20, 1999

[54] HIGH DENSITY SIMM OR DIMM WITH RAS ADDRESS RE-MAPPING

[75] Inventors: Timothy Jay Dell, Colchester; Bruce Gerard Hazelzet; Mark William Kellogg, both of Essex Junction, all of Vt.

[73] Assignee: International Business Machines Corp., Armonk, N.Y.

[21] Appl. No.: 08/598,857

[22] Filed: Feb. 9, 1996

[51] Int. Cl.$^6$ .................................................. G06F 12/00
[52] U.S. Cl. ...................... 711/105; 711/104; 711/106; 711/5; 365/193; 365/230.02; 365/230.03; 365/230.06; 365/222
[58] Field of Search ................................ 365/230.03, 222, 365/193, 230.02, 230.06; 395/405, 497.03, 433; 711/104–106, 5

[56] References Cited

U.S. PATENT DOCUMENTS

| | | | |
|---|---|---|---|
| 5,161,218 | 11/1992 | Catlin | 395/402 |
| 5,465,237 | 11/1995 | Chen et al. | 365/233 |
| 5,500,831 | 3/1996 | Chen et al. | 365/233 |
| 5,596,741 | 1/1997 | Thome | 395/490 |
| 5,600,604 | 2/1997 | Chen | 365/230.06 |
| 5,613,094 | 3/1997 | Khan | 395/500 |

*Primary Examiner*—John W. Cabeca
*Assistant Examiner*—Denise Tran
*Attorney, Agent, or Firm*—William N. Hogg

[57] ABSTRACT

The signal configuration for addressable DRAMs from a system is changed from a signal that actuates a single bank of DRAMs having Y/X row/column addresses actuated by a single RAS, to a signal configuration that provides two RAS signals for two banks of DRAMs having Y-1/X row/column addresses actuated by two RAS signals. This is done by converting the high order address bit from the system to a RAS signal actuated by a system RAS when, and only when, the high order bit is of a given value.

3 Claims, 3 Drawing Sheets

HIGH DENSITY SIMM OR DIMM WITH RAS ADDRESS RE-MAPPING

RELATED APPLICATIONS

This is related to application Ser. No. 08/582,010, filed Jan. 2, 1996 and entitled "Method and Apparatus for Modifying Signals Received by Memory Cards" (Attorney Docket No. BU9-95-057).

BACKGROUND OF THE INVENTION

This invention relates generally to a method and apparatus for converting system signals and addresses from one configuration to a different configuration for use on DRAM memories. In more particular aspects, this invention relates to converting a single master or system RAS signal and the high order bit of a row address generated by a computer system from one configuration of memory addressing to two RAS signals useful in the system for a different memory addressing scheme.

High density memory systems are utilized to maximize performance in many PC server and work station environments. However, certain technological advances are costly to implement, and for certain implementations it is desirable to use less costly technology interchangeably with certain system configurations which can use higher technology. For example, sometimes it is desirable to use 16-meg chips with systems that support 64-meg technology. In such a configuration, a 64 or 72 bit wide data bus using 64-megabit (8M×8) chips can be used. If the system is designed for 8M×8 chips, the JEDEC standard is for a 12×11 address scheme (i.e., 12 row address bits and 11 column address bits). In such a scheme, only one bank is required to read all 64 or 72 bits, and thus only a single RAS signal is needed.

However, 64 megabit chips all utilize 3.3 volt technology which for several reasons is quite expensive and thus, while fewer chips can be used to store the same information, these fewer chips in the aggregate are more expensive than using 16 megabit chips manufactured in 5-volt technology. For example, eight 8M×8 chips can be used to store the same amount of information as is stored in 32 4M×4 chips. However, the 32 4M×4 chips are much cheaper in the aggregate than the eight 8M×8 chips, and thus for many applications, even though more chips are involved, it is desirable to use the 5-volt technology and 4M×4 chips.

Unfortunately, to achieve the same addressable space, 2 banks of 4M×4 DRAM chips are required which have an address configuration of 11 bit row addresses by 11 bit column addresses (11/11) but require 2 RAS signals to actuate the entire range. Expressed another way, 2 banks of 16 11×11 addressable 4M×4 DRAMs (for a total of 32 DRAMs) are necessary to provide the equivalent 8M address steps of 1 bank of 12/11 addressable 8M×8 DRAMs.

Moreover, the standard refresh technique for the 8M×8 technology using 3.3 volts is a CAS Before RAS (CBR) cycle. The current invention relates to CBR implementations.

SUMMARY OF THE INVENTION

According to the present invention, a method and logic circuit are provided which convert the high order address bit output from a computer system together with a single system RAS signal to two SIMM or DIMM RAS's such that a system configured to operate 1 bank of Y/X row/column addressable DRAMs with a single system RAS can operate 2 banks of Y-1/Z row addressable DRAM requiring 2 RAS signals and also provide CBR refresh.

DESCRIPTION OF THE PREFERRED EMBODIMENT(S)

The preferred embodiment will be described in the environment of an IBM personal computer using an Intel 80386 or 80486 or Pentium Microprocessor with Dual Inline Memory Modules (DIMMs) having Dynamic Random Access Memory (DRAM) chips to provide and control the memory's function. The memory modules can also be Single Inline Memory Modules (SIMMs) instead of DIMMs—the difference between DIMMs and SIMMs being that SIMMs have two rows of contacts (one on each side of the assembly), which opposing contacts are tied together. DIMMs also have two rows of contacts, but these are not tied together, allowing a greater number of unique I/O's in the same physical space. Functionally for the purposes of this invention, SIMMs and DIMMs are the same. (A SIMM or DIMM is sometimes referred to as a DRAM card, which means the DRAM and all the chips and circuits on the SIMM or DIMM.) For the purpose of this description, the system will be described as it is used with a CPU capable of generating parity bits for each of the data bytes that it writes, and also reading and comparing parity information read from storage, although such parity generation is not essential for the purpose of the present invention.

Figure 1:
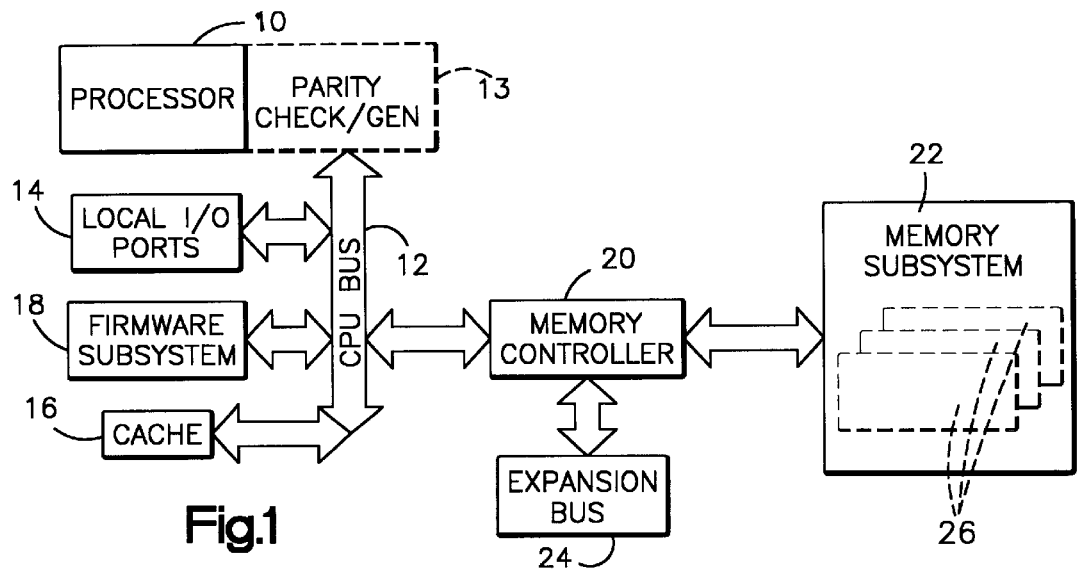
FIG. 1 is a high level diagram showing the interconnections of a personal computer with a bus and an add-on memory card according to this invention.

As can be seen in FIG. 1, there is provided a CPU 10 which is connected to a CPU or system bus 12. A parity generation and check unit 13 preferably is provided which also generates or checks parity of data being either written by or read by the CPU 10 to or from the bus 12. The CPU bus 12 may also have local I/O ports 14, CACHE memory 16 and firmware or other subsystems 18 associated therewith. A memory controller 20 is also connected to the system bus 12, coupling it to a memory subsystem 22, and to an expansion bus 24, if one is present. The memory subsystem 22 is typically comprised of one or more DIMMs 26 (or SIMMs), each of which is provided with DRAM chips. (DRAMs require periodic refresh operations, as opposed to SRAMs which do not require refresh.) It is to be understood that the system as described is illustrative of systems on which the configuration of the DRAM chips and utilization of the signals can be used, but other systems can function in conjunction with the SIMMs or DIMMs having the DRAM configuration of the present invention.

As indicated, the CPU 10 is capable of writing data onto the bus 12, which in turn will be conveyed to the correct memory addresses in the subsystem 22 by a memory controller 20. Upon writing data by the CPU 10, parity bits are generated for each byte of information written to memory by the parity generating and checking device 13 which also checks parity on information read from the memory subsystem 22 during a read cycle to determine if there is parity error. The memory controller 20 also provides the necessary signals, such as the Row Activation Strobe (RAS) for the RAS signal, one of which is generated in the present case, Column Activation Strobe (CAS), Write Enable (WE) and, on some systems, Output Enable (OE) and Byte Select (BS), as well as others not shown, to the memory subsystem 22. The memory controller reads and writes both data and parity to/from each DIMM 26. It should be understood that the invention is applicable to a wide variety of SIMMs or DIMMs having many different form factors, although it is particularly useful for a 72-pin SIMM or a 168-pin DIMM which is configured having the DRAMs actuated by a single system RAS signal as will be explained presently.

Figure 2:
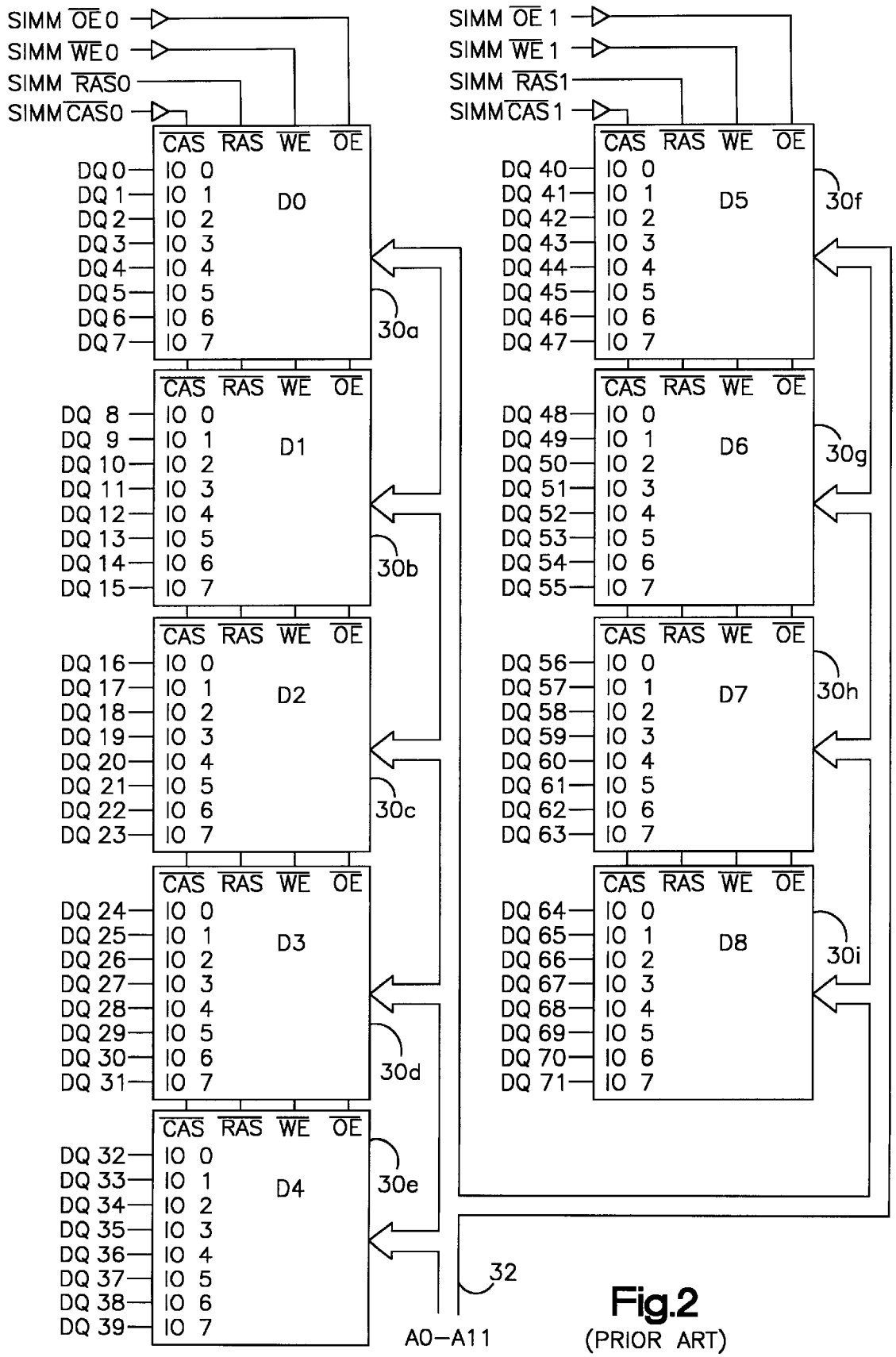
FIG. 2 is a block diagram, somewhat schematic, of the configuration of a DIMM (Dual In-Line Memory Module) utilizing 8M×8 chips to achieve 64 megabytes storage with a 12/11 address configuration.

Referring now to FIG. 2, one typical design of a SIMM or DIMM 26 utilizing 9 8M×8 DRAM chips and a 168 pin DIMM configuration is shown. Conventionally, the configuration uses 64 pins (i.e., pins DQ0–DQ63) as data pins and 8 pins (e.g. DQ64–71) for parity or ECC bits if they are present. If parity and/or ECC bits are not present or need not be stored, then 8 DRAMs rather than 9 can be used. As can be seen in FIG. 2, the DRAMs 30a–30i are arranged in a configuration wherein a single DIMM RAS signal will actuate all of the DRAMs on a read or write cycle, as well as a single RAS actuating the DRAMs on a refresh cycle. Typically, the system of this configuration will do a refresh as a CAS Before RAS (CBR) function, although RAS Only Refresh (ROR) can also be used. However, the present invention is designated for use in applications using CAS Before RAS refresh operation.

During a read or write cycle, the chips are addressed by an address bus having 12 row addresses which are delivered on an address bus 32 as address bits A0–A11. As indicated above, the addressable configuration of the DRAMs 30a–30i is 12/11, i.e., 12 row addresses by 11 column addresses, allowing the storage of 8 megabytes of memory on each DRAM. Thus, the 8 DRAMs 30a–30h used to store the data which is on lines DQ0–DQ63 can store 64 megabytes of data, whereas the remaining DRAM chip 30i can store 8 megabytes of ECC bits. Of course, other storage configurations could be used wherein the data bits, parity or ECC bits are stored together with the respective bytes to which they apply if the parity or ECC is generated on a byte-by-byte basis. As indicated above, the technology used for the manufacture of DRAMs 30a–30i employs very fine lines and thin layers of oxide to achieve this device density; thus, for these and other reasons, these chips are expensive, and while they do function, nevertheless in certain applications it is desirable to use less expensive chips manufactured in 5-volt technology which does not require such close process control, especially in the oxide thickness of the gates of the transistors and device sizes. Moreover, many systems support only 5-volt technology.

Figure 3:
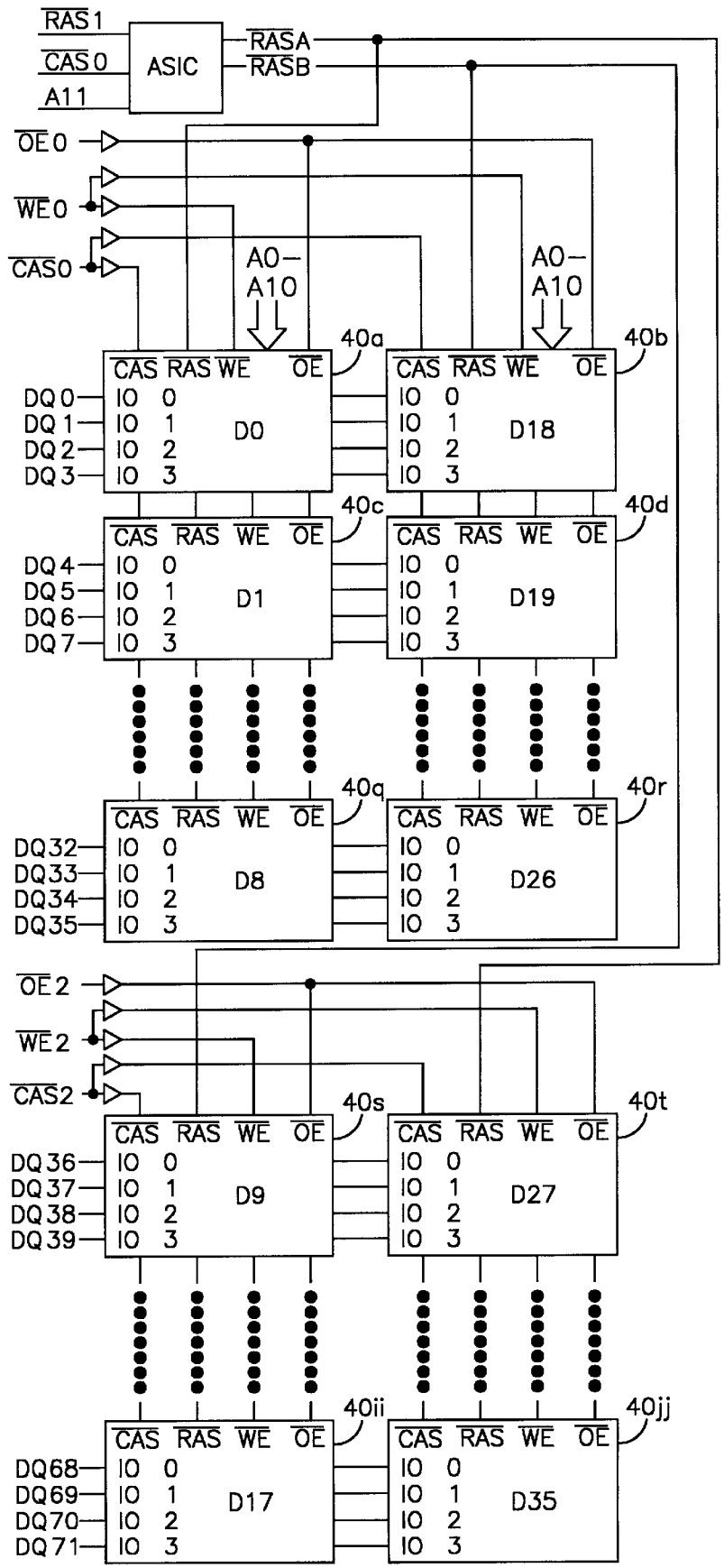
FIG. 3 is a block diagram, somewhat schematic, showing the use of 32 4M×4 chips on a DIMM using an address configuration of 11/11 to achieve 64 megabytes storage capacity.

Referring now to FIG. 3, a block diagram is shown of the present invention. FIG. 3 shows how 64 megabytes of memory storage can be achieved using 2 banks of 4M×4 DRAMs which can be produced using 5-volt technology. An additional four 4M×4 chips are provided to store parity or ECC bits if they are required. As indicated above, in the aggregate, the cost of the 32 4M×4 chips is much less than the cost of eight 8M×8 chips. To achieve the 64 megabytes of memory plus 8 megabytes of storage for ECC or parity bits, 2 banks of 4M×4 DRAMs 40a–40jj are provided. (Some of the chips are indicated only by dots, but they are the same configuration as those chips shown.) Chips 40a, 40c . . . 40q and 40s . . . 40jj constitute one bank, and the chips 40b, 40d . . . 40r, and 40s . . . 40ii constitute a second bank. Since the chips are each 4M×4, it is required to have 4 chips to achieve the same storage capability as 1 chip of the 8M×8 configuration shown in FIG. 2. Moreover, to achieve the same depth of storage, the chips of the 4M×4 configuration are utilized in pairs, such as 40a and 40b constituting a pair, 40c and 40d constituting a pair, through 40ii and 40jj constituting a pair. Thus, the chips 40a, 40b, 40c and 40d store the same amount of data as a single chip 30a of the embodiment shown in FIG. 2 utilizing an 8M×8 configuration.

However, with the 4M×4 chips utilized as shown in FIG. 3, the addressable configuration is 11/11 (i.e., 11 row bits and 11 column bits). Moreover, 2 RAS signals are necessary to address the entire actuatable range of this configuration, RAS A being required to actuate one-half of the chip pair, and RAS B being required to actuate the other half of the chip pair as shown in FIG. 3. However, as indicated earlier, the memory controller 20 of the system generates only a single system or master RAS signal, and the memory configuration shown in FIG. 3 cannot operate with just a single RAS signal being delivered to the DIMM or SIMM card since activation of all four chips simultaneously would result in data contention during read operations, and data corruption (in 2 chips) during a write operation—since unique CAS inputs are not available. To remedy this, logic circuitry is provided on an ASIC chip 46 which receives the high order address bit A11, as well as the system RAS, from the system memory controller 20 and converts them to two RAS actuation signals RAS A and RAS B since the high order address bit A11 generated is not required in the addressing scheme of the chips shown in FIG. 3 as only 11 row addresses are required (A0–A10). Thus, by converting the A11 signal to an additional RAS signal, the necessary second RAS signal can be provided. With the logic on the ASIC chip RAS A is active when, and only when, the system RAS is actuated and the high order bit A11 is "0", and RAS B is active when, and only when, system RAS is actuated and the high order bit A11 is a "1". RAS A will then activate devices 40a, 40c . . . 40q and 40s . . . 40jj and RAS B will activate devices 40b, 40d . . . 40r and 40s . . . 40ii. Thus, because the address scheme of the 4M×4 DRAMs shown in FIG. 3 is 11/11, rather than the 12/11 of the 8M×8 DRAMs as shown in FIG. 2, the high order address bit can be converted to a second RAS signal which is actuated by the system or master RAS signal generated by the memory controller 20 when, and only when, the high order bit is a "1," thus effectively providing the two RAS signals required by the 4M×4 configuration of the chips as shown in FIG. 3. The above activation of RAS A and RAS B is with respect to read or write cycles. Logic provides activation of both RAS A and RAS B during a refresh cycle as will be explained presently.

Figure 4:
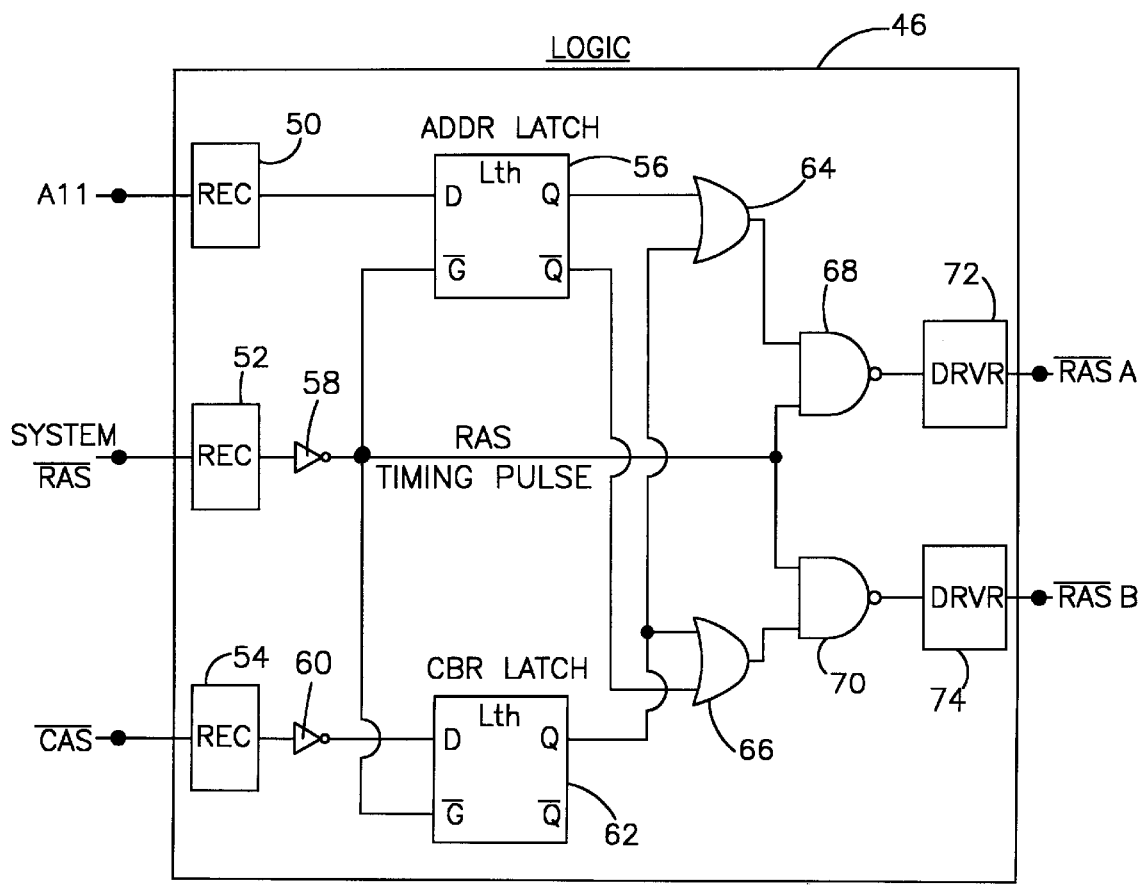
FIG. 4 is a logic diagram showing the logic on an ASIC chip to convert a signal configuration from a master RAS and a 12/11 address configuration to two memory RAS's independently actuatable during read/write cycles and both actuatable during a CBR refresh cycle.

Referring now to FIG. 4, the logic on ASIC chip 46 to convert the high order address bit A11 to a second RAS signal is shown. As shown in FIG. 4, signals from the memory controller 20 are delivered to the ASIC chip 46, the high order bit A11 being delivered to a receiver 50, the master or system RAS signal being delivered to a receiver 52, and the CAS signal being delivered to receiver 54, all on the ASIC chip 46. The output of the receiver 50 is provided as one input to an address latch 56; the output of the receiver 52 is provided as one input to inverter 58; the output of receiver 54 is provided as one input to inverter 60. The output of inverter 60 is provided as one input to CBR (CAS Before RAS) latch; the output of inverter 58 is provided as inputs to the address latch 56 and the CBR latch 62. One output from the address latch 56 is provided as one input to OR gate 64, the other output of the address latch 56 is provided as one input to OR gate 66. The other input to OR gate 66 is provided as the output from CBR latch 62. The output from the OR gate 64 is provided as one input to NAND gate 68, and the output from OR gate 66 is provided as one input to NAND gate 70. The other inputs to each of the NAND gates 68 and 70 are provided by the output of inverter 58. The outputs from the NAND gates 68 and 70 are provided as inputs to drivers 72 and 74, the outputs of which are used to provide RAS A and RAS B signals for actuation of the DRAM chips as shown in FIG. 3.

The purpose of the CBR latch is to assure that, on a refresh cycle, all of the addresses can be refreshed when the refresh cycle is a CBR refresh cycle, as will be explained later in conjunction with the description of the refresh cycle.

The operation of the circuit of FIG. 4 is as follows: In the present design, the RAS and CAS signals are designed to be active LOW (as indicated by the bar over the designations). When the system or master RAS goes active and becomes LOW, it is delivered to the receiver 52, which provides an output to inverter 58, which provides a HIGH signal to NAND gates 68 and 70. Thus, if the other input to NAND gate 68 is HIGH, the NAND gate 68 will output an active LOW signal, and if the other input to NAND gate 70 is HIGH, the NAND gate 70 will output an active LOW signal.

First, assume the case that address bit A11 is a "1". This value will be latched in the address latch 56. (Once the value has been latched in the address latch 56, the address bit A11 is freed and not required to stay in its state during the entire operation.) Since the value received in the address latch is a "1", the address latch 56 will output a HIGH signal to the OR gate 64. (A low level on $\overline{G}$ will cause D input to propagate to Q output. A high level will latch the state of D and reflect this on Q.) Since this is a HIGH signal, the OR gate will output a HIGH signal to NAND gate 68. Since the system or master RAS is LOW, the inverter 58 outputs a HIGH signal to NAND gate 68. Thus, the NAND gate 68 having two HIGH inputs, outputs a LOW active RAS A signal. Since the Q output from the address latch 56 to the OR gate 64 is HIGH, the invert or $\overline{Q}$ output to the OR gate 66 is LOW. Moreover, since the CBR latch is not actuated (for a reason which will be described presently), neither of the inputs to OR gate 66 are HIGH, and thus the NAND gate 70 receives a HIGH input from the system RAS but a LOW input from the OR gate 66, and thus the output from the NAND gate 70 is HIGH which means that RAS B provided by the driver 74 is HIGH and thus not active. Hence, when the system RAS goes active and A11 is a "1", RAS A will be outputted as an active RAS signal to the chip, and RAS B will not be active.

Next, assume that high order address bit A11 is a "0", and the master RAS switch is active low. When the "0" is latched into the address latch 56, the Q output is LOW to OR gate 64. Also since the output from the CBR latch at this point is LOW (which will be explained presently), the output from the OR gate 64 is LOW, providing one LOW input to NAND gate 68. Since one of the inputs to NAND gate 68 is LOW, the output will be HIGH, thus constituting a HIGH RAS A which is not an active RAS. At the same time a $\overline{Q}$ output from address latch 56 is provided to OR gate 66 as a HIGH signal (this being the inverse of the output of the Q signal at latch 56). Thus, since one of the inputs to the OR gate 66 is HIGH, the output from the OR gate 66 will be HIGH to NAND gate 70. Since the master or system RAS signal is active LOW providing the HIGH output from inverter 58 as the other input to NAND gate 70, a LOW output from the NAND gate 70 is generated constitutes an active RAS B from the driver 74.

Thus, when address bit A11 is a "1" and system RAS is actuated, RAS A will be actuated. When address bit A11 is a "0" and the system RAS is actuated, RAS B will be actuated.

It is to be understood that the foregoing description has been described as it relates to read/write cycles and not refresh cycles. In a CBR refresh cycle (which is the CAS signal falling low before RAS falls LOW) when the CAS signal falls LOW and it falls before RAS, this will be latched in CBR latch 62, and outputted as a HIGH signal from latch 62 to both OR gates 64 and 66. The HIGH signals from OR gates 64 and 66 are outputted as HIGH signals to NAND gates 68 and 70. When system RAS then falls, the inverter 58 will provide HIGH signals as the other inputs of NAND gates 68 and 70, thus producing active LOW output from both NAND gates 68 and 70 which will actuate both RAS A and RAS B as active LOW through drivers 72 and 74.

Thus, the input to the SIMM or DIMM configuration shown in FIG. 3 is such that when system or master RAS goes active on a read or write cycle, if the high order address bit A11 is a "1", RAS A will be actuated; if the high order address bit A11 is a "0", RAS B will be actuated. If the cycle is a CBR refresh cycle characterized by the CAS becoming active before RAS, both RAS A and RAS B will be actuated for refresh operation.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of controlling the operation of a memory card in a computer system with signals from a memory controller which outputs Y row address bits and a single system RAS signal and Y-1 column address bits, and a CAS signal, and wherein said memory is comprised of DRAM chips having Y-1 row addresses and Y-1 column address bits, and is divided into first and second sections actuated by first and second RAS signals respectively, said method comprising the steps of:

providing said system RAS signal to said memory during a read or write operation as an active memory RAS A signal when and only when the high order address bit of said address signal is a first value;

providing the high order bit of said Y address as a second memory RAS B signal to said memory card which becomes active during a read or write operation when and only when said high order bit is a second value;

providing a CAS before RAS refresh operation;

storing said CAS signal in a CAS before RAS latch; and providing both said memory RAS A and RAS B signals to said memory card during a refresh operation.

2. A computer system comprising:

a memory controller which outputs Y row address bits and a single system RAS signal and Y-1 column address bits, and a CAS signal;

a memory card including DRAM chips having Y-1 bit row address and Y-1 column address bits, logic circuitry on an integrated circuit chip to receive said system RAS signal and the high order address bit from said memory controller and generate a first memory active RAS A signal to said card responsive to said system RAS signal becoming active when and only when said high order bit has a first value during read/write operations, and generate a second memory RAS B active signal to said card when said system RAS is active and when and only when said high order bit is a second value during read/write operations;

said logic circuitry including a CAS before RAS latch to store said CAS signal; and said logic circuit having circuitry to generate both memory RAS A and memory RAS B active to said card during a refresh cycle when said system RAS is active.

3. The invention as defined in claim 2 wherein said logic circuitry is configured to perform a CAS before RAS refresh.

* * * * *